US012618170B2

(12) United States Patent
Huang et al.

(10) Patent No.: US 12,618,170 B2
(45) Date of Patent: May 5, 2026

(54) GROWTH METHOD FOR SINGLE CRYSTALS OF MAGNESIUM ALUMINATE SPINEL BY EDGE-DEFINED FILM-FED GROWTH TECHNIQUE

(71) Applicants: Sinoma Synthetic Crystals Co., Ltd., Beijing (CN); Beijing Sinoma Synthetic Crystals Co., Ltd., Beijing (CN)

(72) Inventors: Cunxin Huang, Beijing (CN); Muyun Lei, Beijing (CN); Haili Wang, Beijing (CN); Xiaoliang Wang, Beijing (CN)

(73) Assignees: Sinoma Synthetic Crystals Co., Ltd., Beijing (CN); Beijing Sinoma Synthetic Crystals Co., Ltd., Beijing (CN)

( * ) Notice: Subject to any disclaimer, the term of this patent is extended or adjusted under 35 U.S.C. 154(b) by 299 days.

(21) Appl. No.: 18/592,587

(22) Filed: Mar. 1, 2024

(65) Prior Publication Data
US 2024/0200225 A1     Jun. 20, 2024

(30) Foreign Application Priority Data
Mar. 2, 2023     (CN) ........................ 202310192185.X

(51) Int. Cl.
| | |
|---|---|
| *C30B 15/34* | (2006.01) |
| *C30B 15/14* | (2006.01) |
| *C30B 15/22* | (2006.01) |
| *C30B 29/26* | (2006.01) |

(52) U.S. Cl.
CPC .............. *C30B 15/34* (2013.01); *C30B 15/14* (2013.01); *C30B 15/22* (2013.01); *C30B 29/26* (2013.01)

(58) Field of Classification Search
CPC ....... C30B 15/14; C30B 15/206; C30B 15/22; C30B 15/34; C30B 29/26
See application file for complete search history.

(56) References Cited

U.S. PATENT DOCUMENTS

| | | | | | |
|---|---|---|---|---|---|
| 3,990,902 | A | * | 11/1976 | Nishizawa | .............. C30B 19/12 501/153 |
| 4,304,623 | A | * | 12/1981 | Ciszek | .................... C30B 15/34 117/34 |
| 4,443,411 | A | * | 4/1984 | Kalejs | .................... C30B 29/20 117/211 |

(Continued)

*Primary Examiner* — Matthew J Song
(74) *Attorney, Agent, or Firm* — Hemisphere Law, PLLC

(57) ABSTRACT

The present application provides a growth method for single crystals of magnesia-alumina spinel by an edge-defined film-fed growth technique, comprising: putting seed crystals and crystal growth raw materials into a crystal growth furnace; vacuuming the crystal growth furnace, filling with inert gas, heating and melting the crystal growth raw materials; making the seed crystals contact a top end of a seam of a mold, pulling the seed crystals, shouldering, making crystals grow, and annealing to cool down after crystal growth. An upper heat shield and a lower heat shield are arranged above the mold, and a cross section of a slit between the heat shields is a curved surface. The cross section of the slit between the heat shields is controlled as a curved surface, so that the present application achieves the effect of uniform heating of the single crystals of magnesia-alumina spinel in an upward pulling process.

11 Claims, 5 Drawing Sheets

(56)          References Cited

U.S. PATENT DOCUMENTS

| | | | | |
|---|---|---|---|---|
| 4,711,695 A * | 12/1987 | Stormont | ................ | C30B 15/34 |
| | | | | 117/25 |
| 9,926,646 B2 * | 3/2018 | Watanabe | ............... | C30B 15/30 |
| 2005/0064246 A1 * | 3/2005 | Kokta | ..................... | C30B 29/24 |
| | | | | 428/697 |
| 2005/0227117 A1 * | 10/2005 | Locher | ................... | C30B 15/30 |
| | | | | 423/625 |
| 2009/0000538 A1 | 1/2009 | Iwai et al. | | |
| 2012/0298031 A1 | 11/2012 | Ito et al. | | |
| 2015/0233015 A1 | 8/2015 | Fratello | | |

* cited by examiner 8    7    14

GROWTH METHOD FOR SINGLE CRYSTALS OF MAGNESIUM ALUMINATE SPINEL BY EDGE-DEFINED FILM-FED GROWTH TECHNIQUE

TECHNICAL FIELD

The present application relates to the technical field of crystal growth, in particular to a growth method for single crystals of magnesium aluminate spinel by an edge-defined film-fed growth technique.

BACKGROUND

Magnesium aluminate spinel crystal has the advantages of excellent sound transmission, thermal stability, chemical stability and good mechanical and physical properties, and can be widely used in acoustic and microwave devices, GaN epitaxial substrates and support materials for superhard tools.

At present, the growth methods of the magnesium aluminate spinel crystal mainly include the flux method, Verneuil's method, the vertical temperature gradient method and the Czochralski method. However, the above growth method for crystals all have problems: because the melting point of the magnesium aluminate spinel crystal is as high as 2130° C., when MgO and $Al_2O_3$ are used as raw materials to grow the crystal, there is serious non-proportional volatilization of MgO and $Al_2O_3$ on the surface of raw material melt at high temperature, thereby causing defects of inclusions and cores in the crystal, resulting in poor crystal growth quality or small crystal size, which cannot achieve practical application.

SUMMARY

A purpose of the present application is to provide a growth method for single crystals of magnesium aluminate spinel by an edge-defined film-fed growth technique, so as to improve the growth quality of single crystals of magnesium aluminate spinel. A specific technical solution is as follows:

The present application provides a growth method for single crystals of magnesium aluminate spinel by an edge-defined film-fed growth technique, comprising:
1) loading: putting seed crystals and crystal growth raw materials into a crystal growth furnace;
2) vacuuming and gas-filling: vacuuming the crystal growth furnace and then filling with inert gas;
3) heating and melting: raising the temperature of the crystal growth furnace to 2130-2200° C., so that the crystal growth raw materials are melted;
4) seeding: making the seed crystals contact a top end of a seam of a mold, and then pulling the seed crystals so that the crystal growth raw materials condense and grow on the seed crystals;
   an upper heat shield and a lower heat shield are arranged above the mold, and a cross section of a slit between the upper heat shield and the lower heat shield is a curved surface;
5) necking: pulling the seed crystals to shrink the crystals crystallized on the surfaces of the seed crystals;
6) shouldering: thickening and widening the crystals in an upward pulling process;
7) equal-width growth: making the crystals grow with the width of the mold in the upward pulling process;
8) annealing: after the end of crystal growth, starting annealing to cool down.

In an implementation solution of the present application, an upper surface of the lower heat shield is a plane, and a lower surface of the upper heat shield is a curved surface; or the upper surface of the lower heat shield is a curved surface, and the lower surface of the upper heat shield is a plane.

In an implementation solution of the present application, the upper surface of the lower heat shield is a curved surface, the lower surface of the upper heat shield is a plane, and the upper surface of the lower heat shield satisfies at least one of the following features:
   (1) a chord length D of the upper surface of the lower heat shield is 200 mm-400 mm, and a chord height h is 10 mm-30 mm;
   (2) the chord length D of the upper surface of the lower heat shield is 400 mm-700 mm, and the chord height h is 15 mm-60 mm;
   (3) the chord length D of the upper surface of the lower heat shield is 700 mm-1000 mm, and the chord height h is 30 mm-80 mm;
   (4) the chord length D of the upper surface of the lower heat shield is 1000 mm-1500 mm, and the chord height h is 40 mm-100 mm.

In an implementation solution of the present application, the upper surface of the lower heat shield is a plane, the lower surface of the upper heat shield is a curved surface, and the lower surface of the upper heat shield satisfies at least one of the following features:
   (1) a chord length D of the lower surface of the upper heat shield is 200 mm-400 mm, and a chord height h is 10 mm-30 mm;
   (2) the chord length D of the lower surface of the upper heat shield is 400 mm-700 mm, and the chord height h is 15 mm-60 mm;
   (3) the chord length D of the lower surface of the upper heat shield is 700 mm-1000 mm, and the chord height h is 30 mm-80 mm;
   (4) the chord length D of the lower surface of the upper heat shield is 1000 mm-1500 mm, and the chord height h is 40 mm-100 mm.

In an implementation solution of the present application, the mold has two different temperature gradients in horizontal and vertical directions; the temperature of the mold is gradually reduced from edge to middle on the crystal width, with a temperature gradient of 0.1 to 0.3° C./cm; and the temperature is reduced from bottom to top in the vertical direction above the mold, with a temperature gradient of 1-30° C./cm.

In an implementation solution of the present application, the steps of heating and melting comprise: heating the crystal growth furnace to 2130-2200° C., and then holding the temperature for 30-180 min to melt the crystal growth raw materials, so that the crystal growth raw material melt rises to the top end of the seam of the mold.

In an implementation solution of the present application, the steps of seeding comprise: lowering the seed crystals to make the seed crystals contact the top end of the seam of the mold, then raising the temperature by 3-10° C.to melt the seed crystals, holding the temperature for 1-30 min, then lowering the temperature by 5-30° C. and pulling the seed crystals at a rate of 1-100 mm/h so that the crystal growth raw materials condense and grow on the seed crystals.

In an implementation solution of the present application, the steps of necking comprise: pulling the seed crystals and increasing the temperature by 3-20° C., so that the crystals on the surfaces of the seed crystals shrink to ¼-¾ of the area of the seed crystals.

In an implementation solution of the present application, the steps of widening comprise: reducing the temperature by 5-30° C. and adjusting a pulling speed to 1-100 mm/h so that the crystals become thicker and wider in the upward pulling process until the crystal width reaches the width of the mold.

In an implementation solution of the present application, the mold is composed of two metal plates; space between the two metal plates is 0.1-1 mm to form the seam; the top end of the seam of the mold is provided with an opening; and an angle of the opening is 80°-180°.

In an implementation solution of the present application, the inert gas is at least one of Ar or $N_2$.

Beneficial Effects of the Present Application

In the growth method for single crystals of magnesium aluminate spinel by the edge-defined film-fed growth technique provided by the present application, the upper heat shield and the lower heat shield are arranged above the mold, and the cross section of the slit between the upper heat shield and the lower heat shield is controlled as a curved surface, thereby achieving the effect of uniform heating of the single crystals of magnesium aluminate spinel in the upward pulling process, reducing the defects such as bubbles, inclusions and growth striations in single crystals of magnesium aluminate spinel, and improving the growth quality of single crystals of magnesium aluminate spinel. In the present application, the upper heat shield and the lower heat shield are arranged above the mold, which also provides two crystal growth environments with different temperature gradients for the crystals in the horizontal and vertical directions, and provides a growth driving force for the growth of single crystals of magnesium aluminate spinel, which is conducive to controlling the growth quality of single crystals of magnesium aluminate spinel.

Of course, the implementation of any product or method of the present application is not necessarily required to achieve all of the above advantages.

DESCRIPTION OF DRAWINGS

To more clearly describe the technical solutions in the embodiments of the present application or in the prior art, the drawings required to be used in the description of the embodiments or the prior art will be simply presented below. Apparently, the drawings in the following description are merely some embodiments of the present application, and for those ordinary skilled in the art, other embodiments can also be obtained according to these drawings.

REFERENCE SIGNS furnace shell—1, thermal insulation layer—2, heater—3, mold—4, crucible body—5, crucible cover plate—6, lower heat shield—7, upper heat shield—8, metal plate—9, seam—10, opening—11, upper surface of lower heat shield—12, lower surface of upper heat shield—13, cross section of slit between upper heat shield and lower heat shield—14.

DETAILED DESCRIPTION

Technical solutions in embodiments of the present application are described clearly and completely below in combination with the drawings in the embodiments of the present application. Apparently, the described embodiments are merely part of the embodiments of the present application, not all of the embodiments. Based on the embodiments in the present application, all other embodiments obtained by those ordinary skilled based on the present application belong to the protection scope of the present application.

The present application provides a growth method for single crystals of magnesium aluminate spinel by an edge-defined film-fed growth technique, comprising:

1) loading: putting seed crystals and crystal growth raw materials into a crystal growth furnace;

2) vacuuming and gas-filling: vacuuming the crystal growth furnace and then filling with inert gas;

3) heating and melting: raising the temperature of the crystal growth furnace to 2130-2200° C., so that the crystal growth raw materials are melted;

4) seeding: making the seed crystals contact a top end of a seam of a mold, and then pulling the seed crystals so that the crystal growth raw materials condense and grow on the seed crystals;

an upper heat shield and a lower heat shield are arranged above the mold, and a cross section of a slit between the upper heat shield and the lower heat shield is a curved surface;

5) necking: pulling the seed crystals to shrink the crystals crystallized on the surfaces of the seed crystals;

6) shouldering: thickening and widening the crystals in an upward pulling process;

7) equal-width growth: making the crystals grow with the width of the mold in the upward pulling process;

8) annealing: after the end of crystal growth, starting annealing to cool down.

Figure 1:
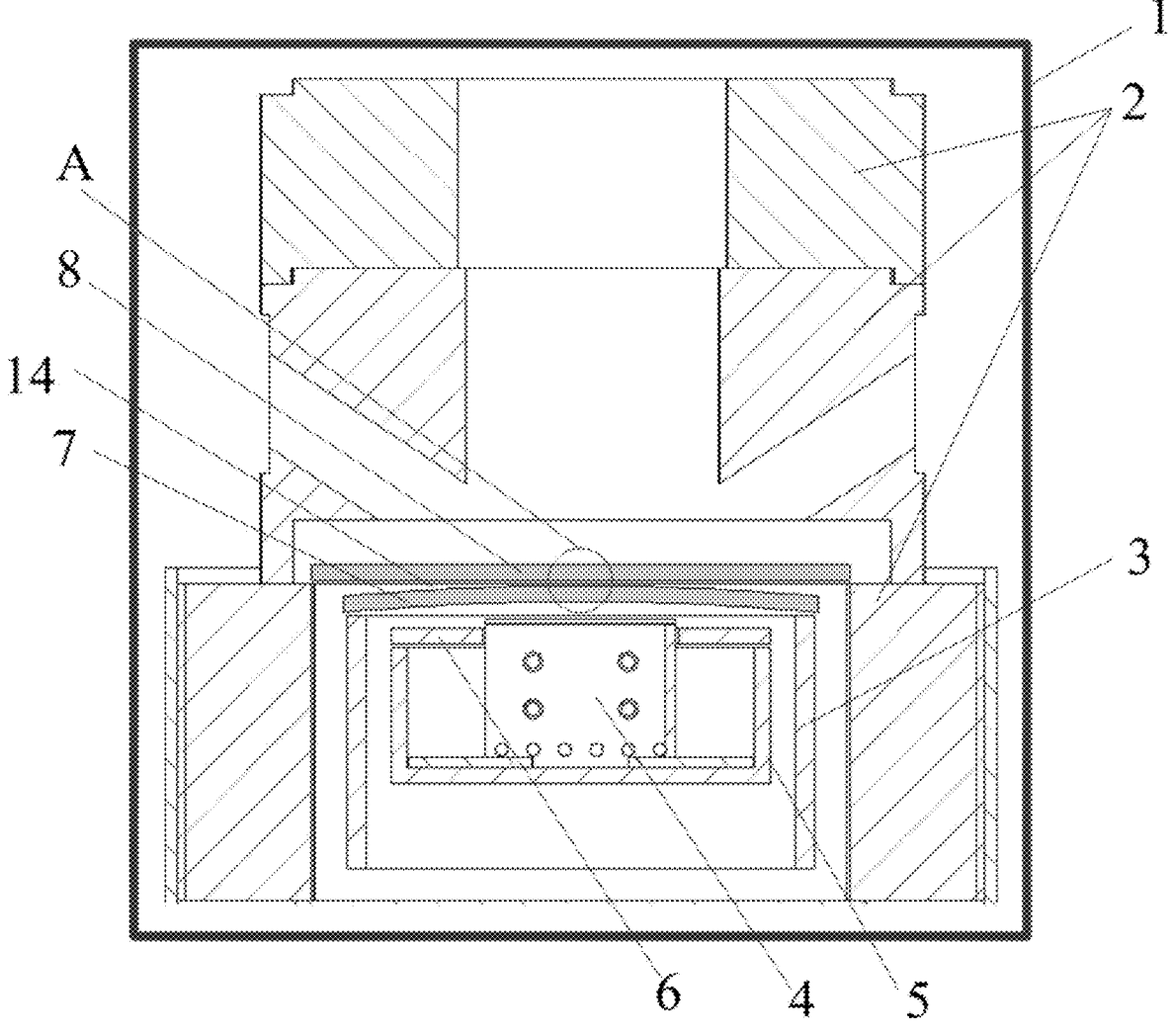
FIG. 1 is a structural schematic diagram of a crystal growth furnace in an implementation solution of the present application.
Figure 2:
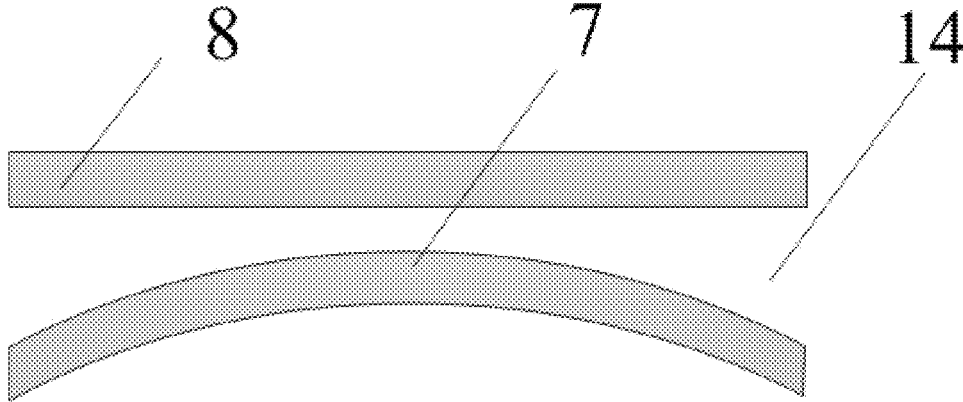
FIG. 2 is a local enlarged view at A in FIG. 1.

As shown in FIG. 1 and FIG. 2, in the growth method for single crystals of magnesium aluminate spinel by the edge-defined film-fed growth technique provided by the present application, the upper heat shield 8 and the lower heat shield 7 are arranged above the mold 4, and the cross section 14 of the slit between the upper heat shield 8 and the lower heat shield 7 is controlled as a curved surface, thereby achieving the effect of uniform heating of the single crystals of magnesium aluminate spinel in the upward pulling process, reducing the defects such as bubbles, inclusions and growth striations in single crystals of magnesium aluminate spinel, and improving the growth quality of single crystals of magnesium aluminate spinel. In the present application, the upper heat shield 8 and the lower heat shield 7 are arranged above the mold 4, which also provides two crystal growth environments with different temperature gradients for the crystals in the horizontal and vertical directions, and provides a growth driving force for the growth of single crystals of magnesium aluminate spinel, which is conducive to controlling the growth quality of single crystals of magnesium aluminate spinel.

The present application has no special limitation to the crystal growth furnace, as long as the purpose of the present application can be achieved. For example, as shown in FIG.

1, a furnace shell 1 of the crystal growth furnace can be any one of a square, rectangle or cylinder, and the material of a thermal insulation layer 2 in the crystal growth furnace comprises at least one of graphite, tungsten, molybdenum, zirconia, rhenium and iridium. The material of a heater 3 comprises at least one of graphite, tungsten, molybdenum, rhenium and iridium. The material of the mold 4 comprises at least one of tungsten, molybdenum, rhenium and iridium. The material of a crucible body 5 comprises at least one of tungsten, molybdenum, rhenium and iridium. The material of a crucible cover plate 6 comprises at least one of tungsten, molybdenum, rhenium and iridium. The material of the lower heat shield 7 comprises at least one of tungsten, molybdenum, rhenium and iridium. The material of the upper heat shield 8 comprises at least one of tungsten, molybdenum, rhenium and iridium. The heater 3 is arranged at the periphery of the crucible 5. The mold 4 is arranged inside the crucible 5. The dimensions of the crucible 5 and the heater 3 are matched with the dimension of the mold 4. The heating mode of the heater comprises at least one of medium frequency induction heating and AC and DC resistance heating. The dimension, heating mode and power of the crystal growth furnace in the present application can be customized according to needs.

The present application has no special limitation to crystal growth raw materials, as long as the purpose of the present application can be achieved. For example, the present application uses polycrystalline blocks of magnesium aluminate spinel having purity of more than or equal to 99.99% as crystal growth raw materials. The crystal growth raw materials having high purity are conducive to reducing impurities in single crystal products of magnesium aluminate spinel. Moreover, the present application directly uses polycrystalline blocks of magnesium aluminate spinel instead of MgO and $Al_2O_3$ as the crystal growth raw materials, which reduces the non-proportional volatilization of MgO and $Al_2O_3$ at high temperature, and thus reduces the defects such as inclusions caused by component segregation in the growth process of single crystals of magnesium aluminate spinel.

Figure 4:
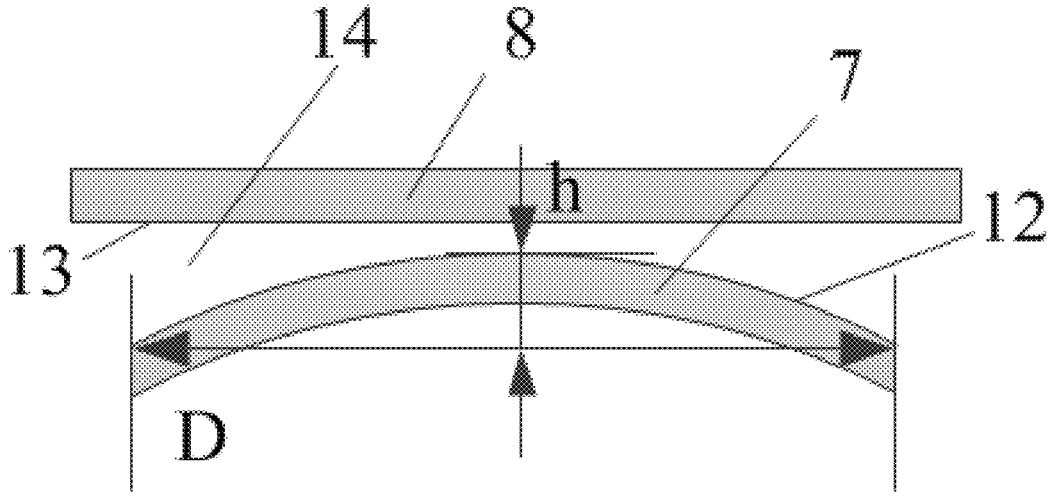
FIG. 4 is a first structural schematic diagram of a lower surface of an upper heat shield and an upper surface of a lower heat shield in an implementation solution of the present application.
Figure 5:
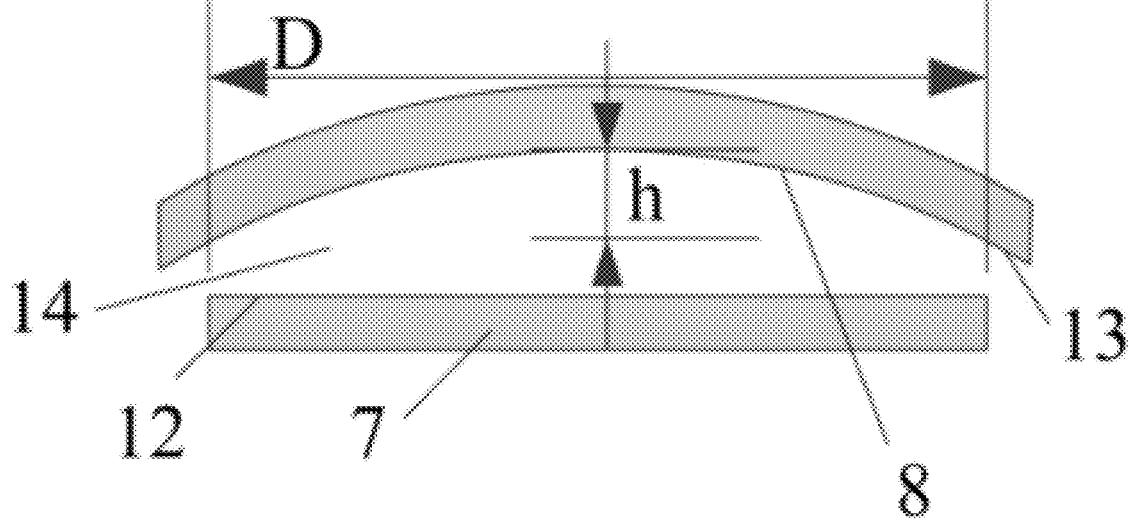
FIG. 5 is a second structural schematic diagram of a lower surface of an upper heat shield and an upper surface of a lower heat shield in an implementation solution of the present application.

In a specific implementation solution of the present application, as shown in FIG. 4, an upper surface 12 of the lower heat shield is a curved surface, and a lower surface 13 of the upper heat shield is a plane; or, as shown in FIG. 5, the upper surface 12 of the lower heat shield is a plane, and the lower surface 13 of the upper heat shield is a curved surface. In the prior art, in the upward pulling process, the single crystals of magnesium aluminate spinel shall have a proper temperature gradient from bottom to top in a radial direction from middle to edge and in a vertical (axial) direction above the mold. Too high, too low and unstable temperature gradient is easy to lead to defects such as bubbles, inclusions and growth streaks in the single crystals of magnesium aluminate spinel. In the present application, by controlling the upper surface 12 of the lower heat shield and the lower surface 13 of the upper heat shield to be the above shapes, the proper radial and axial temperature gradient effects of the single crystals of magnesium aluminate spinel in the upward pulling process are realized, the defects such as bubbles, inclusions and growth streaks inside the single crystals of magnesium aluminate spinel are reduced, and the growth quality of the single crystals of magnesium aluminate spinel is improved.

In a specific implementation solution of the present application, as shown in FIG. 4, the upper surface 12 of the lower heat shield is a curved surface, the lower surface 13 of the upper heat shield is a plane, and the upper surface 12 of the lower heat shield satisfies at least one of the following features:

(1) a chord length D of the upper surface 12 of the lower heat shield is 200 mm-400 mm, and a chord height h is 10 mm-30 mm;

(2) the chord length D of the upper surface 12 of the lower heat shield is 400 mm-700 mm, and the chord height h is 15 mm-60 mm;

(3) the chord length D of the upper surface 12 of the lower heat shield is 700 mm-1000 mm, and the chord height h is 30 mm-80 mm;

(4) the chord length D of the upper surface 12 of the lower heat shield is 1000 mm-1500 mm, and the chord height h is 40 mm-100 mm.

In the present application, by controlling the upper surface 12 of the lower heat shield as a curved surface and the lower surface 13 of the upper heat shield as a plane, the cross section 14 of the slit between the upper heat shield and the lower heat shield is a curved surface, and then the proper temperature gradient effect in the axial and radial directions in the upward pulling process of the single crystals of magnesium aluminate spinel is realized. By controlling the chord length D and the chord height h of the upper surface 12 of the lower heat shield to satisfy at least one of the above ranges, the present application further reduces the defects such as bubbles, inclusions and growth streaks inside the single crystals of magnesium aluminate spinel, and improves the growth quality of the single crystals of magnesium aluminate spinel.

In a specific implementation solution of the present application, as shown in FIG. 5, the upper surface 12 of the lower heat shield is a plane, the lower surface 13 of the upper heat shield is a curved surface, and the lower surface 13 of the upper heat shield satisfies at least one of the following features:

(1) a chord length D of the lower surface 13 of the upper heat shield is 200 mm-400 mm, and a chord height h is 10 mm-30 mm;

(2) the chord length D of the lower surface 13 of the upper heat shield is 400 mm-700 mm, and the chord height h is 15 mm-60 mm;

(3) the chord length D of the lower surface 13 of the upper heat shield is 700 mm-1000 mm, and the chord height h is 30 mm-80 mm;

(4) the chord length D of the lower surface 13 of the upper heat shield is 1000 mm-1500 mm, and the chord height h is 40 mm-100 mm.

In the present application, by controlling the lower surface 13 of the upper heat shield as a curved surface and the upper surface 12 of the lower heat shield as a plane, the cross section 14 of the slit between the upper heat shield and the lower heat shield is a curved surface, and then the proper temperature gradient effect in the axial and radial directions in the upward pulling process of the single crystals of magnesium aluminate spinel is realized. By controlling the chord length D and the chord height h of the lower surface 13 of the upper heat shield to satisfy at least one of the above ranges, the present application further reduces the defects such as bubbles, inclusions and growth streaks inside the single crystals of magnesium aluminate spinel, and improves the growth quality of the single crystals of magnesium aluminate spinel.

In a specific implementation solution of the present application, the mold has two different temperature gradients in horizontal and vertical directions; the temperature of the mold is gradually reduced from edge to middle on the crystal width, with a temperature gradient of 0.1 to 0.3° C./cm; and the temperature is reduced from bottom to top in the vertical direction above the mold, with a temperature gradient of 1-30° C./cm. In the present application, by controlling the temperature gradient of the mold from the edge to the middle in the crystal width and the temperature gradient from bottom to top in the vertical direction above the mold to be within the above ranges, it is beneficial to reduce the defects such as bubbles, inclusions and growth streaks in the single crystals of magnesium aluminate spinel. By controlling the mold to have two different temperature gradients in the horizontal and vertical directions, the present application also provides two crystal growth environments with different temperature gradients for the crystals in the horizontal and vertical directions, and provides a growth driving force for the growth of single crystals of magnesium aluminate spinel, which is conducive to controlling the growth quality of single crystals of magnesium aluminate spinel.

In a specific implementation solution of the present application, the steps of heating and melting comprise: heating the crystal growth furnace to 2130-2200° C., and then holding the temperature for 30-180 min to melt the crystal growth raw materials, so that the crystal growth raw material melt rises to the top end of the seam of the mold. The present application controls the temperature and holding time of the crystal growth furnace to be within the above ranges to achieve full melting of the crystal growth raw materials. The present application makes the molten crystal growth raw materials climb to the top end of the seam of the mold through the capillary action, and the crystals can be grown from a small number of melts and formed near dimensions, which reduces the loss of the materials and reduces the cost of crystal growth and subsequent processing.

In a specific implementation solution of the present application, the steps of seeding comprise: lowering the seed crystals to make the seed crystals contact the top end of the seam of the mold, then raising the temperature by 3-10° C. to melt the seed crystals, holding the temperature for 1-30 min, then lowering the temperature by 5-30° C. and pulling the seed crystals at a rate of 1-100 mm/h. By controlling the degree of cooling and the pulling speed of the seed crystals to be within the above ranges, the present application is conducive to making the crystal growth raw materials condense and grow on the seed crystals. Not limited to any theory, the present application preheats the seed crystals by lowering the seed crystals to 2-6 mm from the bottom of the seed crystals to the upper part of the opening of the seam of the mold before seeding, and then lowers the seed crystals, so that the seed crystals and the molten crystal growth raw materials at the opening of the seam of the mold can melt into a whole more fully.

In a specific implementation solution of the present application, the steps of necking comprise: pulling the seed crystals and increasing the temperature by 3-20° C., so that the crystals on the surfaces of the seed crystals shrink to ¼-¾ of the area of the seed crystals. By controlling the temperature rise degree and the crystallization shrinkage area of the seed crystal surfaces to be within the above ranges, the present application is conducive to the exclusion of crystal growth defects, thereby reducing the defects inside the single crystals of magnesium aluminate spinel.

In a specific implementation solution of the present application, the steps of widening comprise: reducing the temperature by 5-30° C. and adjusting a pulling speed to 1-100 mm/h so that the crystals become thicker and wider in the upward pulling process until the crystal width reaches the width of the mold. Not limited to any theory, by controlling the degree of cooling and the pulling speed of seed crystals to be within the above ranges, the present application can grow platelike single crystals of magnesium aluminate spinel with a width of more than 4 inches, thereby reducing the processing removal amount of processing columnar crystals grown by other methods (such as Kyropoulos method, etc.) into platelike crystals, further improving the crystal yield, reducing the preparation and processing cost of the single crystals of magnesium aluminate spinel, and widening the application of the single crystals of magnesium aluminate spinel.

Figure 3:
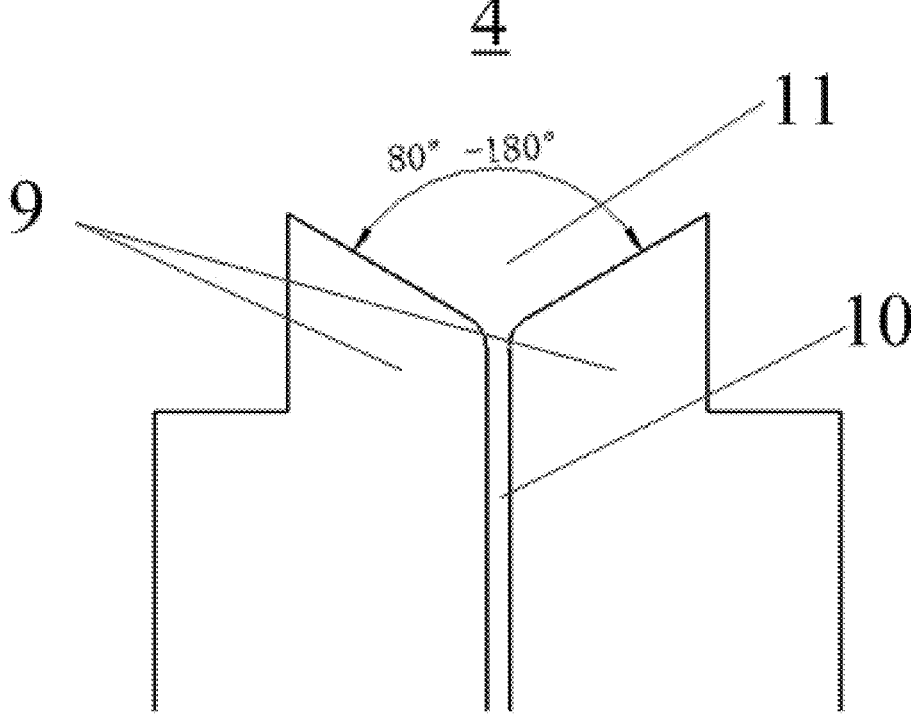
FIG. 3 is a structural schematic diagram of a mold in an implementation solution of the present application.

In a specific implementation solution of the present application, as shown in FIG. 3, the mold 4 is composed of two metal plates 9; space between the two metal plates 9 is 0.1-1 mm to form a seam 10; the top end of the seam 10 of the mold is provided with an opening 11; and an angle of the opening 11 is 80°-180°. By controlling the space between the two metal plates to be within the above range, the present application can effectively improve the capillary action of the crystal growth raw material melt in the seam, and then improves the feeding strength of the seam of the mold, that is, increases the feeding amount in the crystal growth process. The present application has no special limitation to the width and the thickness of the mold, and any size can be customized according to product needs, as long as the purpose of the present application can be achieved.

In a specific implementation solution of the present application, the inert gas is at least one of Ar or $N_2$. Not limited to any theory, the present application provides an inert atmosphere for easily oxidized thermal field materials in the crystal growth furnace by filling the crystal growth furnace with the above inert gas, effectively inhibits the oxidation and volatilization of the thermal field materials in the crystal growth furnace, improves the service life of the thermal field materials in the crystal growth furnace, and also reduces the pollution to the crystal growth raw materials caused by the oxidation and volatilization of the thermal field materials, thereby reducing the impurity content in the single crystals of magnesium aluminate spinel and improving the growth quality of the single crystals of magnesium aluminate spinel.

EMBODIMENTS

Embodiments and reference examples are provided below for describing the implementation of the present application more specifically. Various tests and evaluations are carried out according to the following methods. In addition, unless otherwise explained, "part" and "%" are the mass basis.

Test Method and Device

Detection of Crystal Shape, Haze and Defects in Crystal:

The crystal shape, the haze, and the crystal defects such as visible bubbles, inclusions and growth streaks are visually observed by using a 5× magnifying glass under an ordinary white light source of 10 watts in a darkroom through an artificial lamp inspection method.

Embodiment 1

<Loading>

Polycrystalline blocks of magnesium aluminate spinel with purity of 99.999% as the crystal growth raw materials are washed and dried by anhydrous ethanol and deionized water, and then put into the crystal growth furnace together with the seed crystals of magnesium aluminate spinel that grow along the <010> direction.

<Vacuuming and Gas-Filling>

When the crystal growth furnace is vacuumed to $3 \times 10^{-3}$ Pa, then the crystal growth furnace is filled with Ar gas with purity of 99.99%.

<Heating and Melting>

The crystal growth furnace is heated to 2150° C. and then kept for 40 min to melt the polycrystalline blocks of magnesium aluminate spinel.

<Seeding>

As shown in FIG. 3, the seed crystals are lowered to 4 mm from the bottom of the seed crystals to the upper part of the opening 11 of the seam of the mold, and preheated; seed crystal rods are lowered so that the bottom of the seed crystals contacts the opening 11 of the seam of the mold; then the temperature of the crystal growth furnace is raised by 5° C. and kept for 20 min to melt the seed crystals and then start to lead the crystals. The temperature of the crystal growth furnace is reduced by 15° C. and the seed crystals are pulled at a rate of 10 mm/h, so that the crystal growth raw materials condense and grow on the seed crystals until the seed crystals and the melted crystal growth raw materials at the opening of the seam of the mold are melted into a whole to stop leading the crystals, wherein an upper heat shield 8 and a lower heat shield 7 are arranged above the mold 4; the upper surface 12 of the lower heat shield, as shown in FIG. 4, is a curved surface; the lower surface 13 of the upper heat shield is a plane; the chord length D of the upper surface 12 of the lower heat shield is 300 mm, and the chord height h is 20 mm. The temperature of the mold is gradually decreased from the edge to the middle on the crystal width. The temperature gradient is 0.2° C./cm. The temperature is gradually decreased from bottom to top in the vertical direction above the mold. The temperature gradient is 15° C./cm, the width of the seam 10 is 0.5 mm, and an angle of the opening 11 is 130°.

<Necking>

The temperature of the crystal growth furnace is increased by 5° C. and simultaneously, the seed crystals are pulled to slightly crystallize the seed crystals, so that the crystals on the surfaces of the seed crystals shrink to ⅔ of the sectional area of the seed crystals.

<Shouldering>

After the end of necking, the pulling speed of the seed crystals is adjusted to 20 mm/h, and meanwhile, the temperature of the crystal growth furnace is reduced by 15° C., so that the crystals become thicker and wider in the upward pulling process until the crystal width reaches the width of the mold 4.

<Equal-Width Growth>

The temperature of the crystal growth furnace is reduced by 15° C., and the seed crystals are continued to be pulled at a rate of 20 mm/h, so that the crystals grow at the width of the mold 4 in the upward pulling process until the crystal growth raw materials in the crucible 5 are exhausted or supplied insufficiently; and the crystals are separated from the mold 4.

<Annealing>

After the end of crystal growth, the positions of the crystals are kept unchanged. After constant temperature for 5 h, the crystal growth furnace 1 is controlled to cool to room temperature within 40 hours, and the crystals are finally taken out.

Embodiment 2

The present embodiment is the same as embodiment 1 except that the chord length D of the upper surface of the lower heat shield, the chord height h of the upper surface of the lower heat shield and the heating and melting time of the crystal growth furnace are adjusted as shown in Table 1 in the process of <seeding>.

Embodiment 3

The present embodiment is the same as embodiment 1 except that the chord length D of the upper surface of the lower heat shield, the chord height h of the upper surface of the lower heat shield, the heating and melting time of the crystal growth furnace and the angle of the opening are adjusted as shown in Table 1 in the process of <seeding>.

Embodiment 4

The present embodiment is the same as embodiment 1 except that the chord length D of the upper surface of the lower heat shield, the chord height h of the upper surface of the lower heat shield, and the heating and melting temperature and time of the crystal growth furnace are adjusted as shown in Table 1 in the process of <seeding>.

Embodiment 5 to Embodiment 8

The present embodiment is the same as embodiment 1 except that the chord length D of the lower surface of the upper heat shield, the chord height h of the lower surface of the upper heat shield, and the heating and melting time of the crystal growth furnace are adjusted as shown in Table 1 in the process of <seeding>.

Embodiment 9 to Embodiment 11

The present embodiment is the same as embodiment 1 except that the chord length D of the upper surface of the lower heat shield, the chord height h of the upper surface of the lower heat shield, the heating and melting temperature and time of the crystal growth furnace and the pulling speed in the process of <shouldering> are adjusted as shown in Table 1 in the process of <seeding> to adjust the temperature gradient of the mold in the horizontal direction and the vertical direction as shown in Table 1.

Embodiment 12 to Embodiment 13

The present embodiment is the same as embodiment 1 except that the heating and melting temperature and time of the crystal growth furnace, the preparation parameters of the steps of seeding, necking and shouldering, the width of the seam and the angle of the opening are adjusted as shown in Table 1 in the process of <seeding>.

Embodiment 14

The present embodiment is the same as embodiment 1 except that the type of inert gas is adjusted, the growth direction of the seed crystals of magnesium aluminate spinel is adjusted to <110>, the distance between the seed crystal rod and the upper part of the opening is adjusted to 4 mm, and in the process of equal-width growth, the temperature is reduced by 10° C., and the annealing time is 70 h as shown in Table 1 in the process of <vacuuming and gas-filling>.

Reference Example 1

Reference example 1 is the same as the embodiments except that the temperature gradient of the mold is adjusted by assistance as shown in Table 1 by adjusting the upper surface of the lower heat shield and the lower surface of the upper heat shield as planes.

Reference Example 2

Reference example 2 is the same as embodiment 8 except that the temperature gradient of the mold is adjusted by assistance as shown in Table 1 by adjusting the upper surface of the lower heat shield and the lower surface of the upper heat shield as planes.

TABLE 1

| No. | Chord length D of upper surface of lower heat shield (mm) | Chord height h of upper surface of lower heat shield (mm) | Chord length D of lower surface of upper heat shield (mm) | Chord height h of lower surface of upper heat shield (mm) | Temperature gradient of mold in horizontal direction (° C./cm) | Temperature gradient of mold in vertical direction (° C./cm) | Heating and melting temperature of crystal growth furnace (° C.) |
|---|---|---|---|---|---|---|---|
| Embodiment 1 | 300 | 20 | / | / | 0.2 | 15 | 2150 |
| Embodiment 2 | 550 | 40 | / | / | 0.2 | 15 | 2150 |
| Embodiment 3 | 850 | 60 | / | / | 0.2 | 15 | 2150 |
| Embodiment 4 | 1250 | 90 | / | / | 0.2 | 15 | 2160 |
| Embodiment 5 | / | / | 300 | 20 | 0.2 | 15 | 2150 |
| Embodiment 6 | / | / | 550 | 40 | 0.2 | 15 | 2150 |
| Embodiment 7 | / | / | 850 | 60 | 0.2 | 15 | 2150 |
| Embodiment 8 | / | / | 1250 | 90 | 0.2 | 15 | 2150 |
| Embodiment 9 | 200 | 10 | / | / | 0.1 | 10 | 2140 |
| Embodiment 10 | 1000 | 80 | / | / | 0.2 | 30 | 2150 |
| Embodiment 11 | 1500 | 90 | / | / | 0.3 | 30 | 2160 |
| Embodiment 12 | 300 | 20 | / | / | 0.2 | 15 | 2200 |
| Embodiment 13 | 300 | 20 | / | / | 0.2 | 15 | 2150 |
| Embodiment 14 | 300 | 20 | / | / | 0.2 | 15 | 2150 |
| Reference example 1 | / | / | / | / | 0.2 | 50 | 2150 |
| Reference example 2 | / | / | / | / | 0.2 | 50 | 2150 |

| No. | Heating and melting time of crystal growth furnace (min) | Seeding step | Necking step | Shouldering step | Seam width and opening angle | Typ of insert gas |
|---|---|---|---|---|---|---|
| Embodiment 1 | 40 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Embodiment 2 | 50 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |

TABLE 1-continued

| | | | | | |
|---|---|---|---|---|---|
| Embodiment 3 | 60 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Embodiment 4 | 80 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Embodiment 5 | 40 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Embodiment 6 | 50 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Embodiment 7 | 70 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Embodiment 8 | 120 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Embodiment 9 | 30 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 10 mm/h | 0.5 mm, 130° | Ar |
| Embodiment 10 | 80 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 10 mm/h | 0.5 mm, 130° | Ar |

TABLE 1-continued

| | | | | | | |
|---|---|---|---|---|---|---|
| Embodiment 11 | 180 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 50 mm/h | 0.5 mm, 130° | Ar |
| Embodiment 12 | 30 | Raising the temperature by 3° C., holding for 1 min, cooling by 5° C., and pulling at a rate of 1 mm/h | Raising the temperature by 3° C., and shrinking the crystals on surfaces of seed crystals to ¼ of the area of seed crystals | Reducing the temperature by 5° C., and pulling at a rate of 1 mm/h | 0.1 mm, 80° | Ar |
| Embodiment 13 | 40 | Raising the temperature by 10° C., holding for 30 min, cooling by 15° C., and pulling at a rate of 10 mm/h | Raising the temperature by 20° C., and shrinking the crystals on surfaces of seed crystals to ¾ of the area of seed crystals | Reducing the temperature by 30° C., and pulling at a rate of 100 mm/h | 1 mm, 180° | Ar |
| Embodiment 14 | 40 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 50 mm/h | 0.5 mm, 130° | $N_2$ |
| Reference example 1 | 40 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |
| Reference example 2 | 120 | Raising the temperature by 5° C., holding for 20 min, cooling by 15° C., and pulling at a rate of 10 mm/h | Raising the temperature by 5° C., and shrinking the crystals on surfaces of seed crystals to ⅔ of the area of seed crystals | Reducing the temperature by 15° C., and pulling at a rate of 20 mm/h | 0.5 mm, 130° | Ar |

Note: "/" in Table 1 indicates that there is no relevant preparation parameter.

TABLE 2

| | Crystal shape | Haze | Defects in crystals |
|---|---|---|---|
| Embodiment 1 | Complete | Colorless and transparent | No visible defect |
| Embodiment 2 | Complete | Colorless and transparent | No visible defect |
| Embodiment 3 | Complete | Colorless and transparent | No visible defect |
| Embodiment 4 | Complete | Colorless and transparent | No visible defect |
| Embodiment 5 | Complete | Colorless and transparent | No visible defect |
| Embodiment 6 | Complete | Colorless and transparent | No visible defect |
| Embodiment 7 | Complete | Colorless and transparent | No visible defect |
| Embodiment 8 | Complete | Colorless and transparent | No visible defect |
| Embodiment 9 | Complete | Colorless and transparent | No visible defect |

TABLE 2-continued

|  | Crystal shape | Haze | Defects in crystals |
| --- | --- | --- | --- |
| Embodiment 10 | Complete | Colorless and transparent | No visible defect |
| Embodiment 11 | Complete | Colorless and transparent | No visible defect |
| Embodiment 12 | Complete | Colorless and transparent | No visible defect |
| Embodiment 13 | Complete | Colorless and transparent | No visible defect |
| Embodiment 14 | Complete | Colorless and transparent | No visible defect |
| Reference example 1 | Most complete, with growth streaks in the center | Colorless and transparent | With a few tiny bubbles locally |
| Reference example 2 | Most complete, with growth streaks in the center | Colorless and transparent | With a few tiny bubbles locally |

By referring to Table 1 to Table 2, it can be seen from embodiment 1 to embodiment 14 and reference example 1 to reference example 2 that through the growth method for single crystals of magnesium aluminate spinel by the edge-defined film-fed growth technique provided by the present application, the upper heat shield and the lower heat shield are arranged above the mold, and the cross section of the slit between the upper heat shield and the lower heat shield is controlled as a curved surface, thereby achieving the effect of uniform heating of the single crystals of magnesium aluminate spinel in the upward pulling process. Thus, the prepared single crystals of magnesium aluminate spinel are complete in shape, and colorless and transparent; and there is no defect such as inclusion except for a small number of tiny bubbles that can be removed during processing without influence on use on the crystal surfaces. The single crystals of magnesium aluminate spinel grown in reference example 1 and reference example 2 produce growth streaks in the center and have tiny bubbles locally. It can be seen that the growth method for single crystals of magnesium aluminate spinel by the edge-defined film-fed growth technique provided by the present application effectively reduces the defects such as bubbles, inclusions and growth streaks in the crystal centers inside the single crystals of magnesium aluminate spinel, and improves the growth quality of the single crystals of magnesium aluminate spinel. In the present application, the upper heat shield and the lower heat shield are arranged above the mold, which also provides two crystal growth environments with different temperature gradients for the crystals in the horizontal and vertical directions, and provides a growth driving force for the growth of single crystals of magnesium aluminate spinel, which is conducive to controlling the growth quality of single crystals of magnesium aluminate spinel.

It should be noted that terms of "comprise", "include" or any other variant herein are intended to cover non-exclusive inclusion, so that a process, a method, an article or a device which includes a series of elements not only includes such elements, but also includes other elements not listed clearly or also includes inherent elements in the process, the method, the article or the device. Each embodiment in the description is described in a relevant way. The same and similar parts among all of the embodiments can be referred to each other. The difference of each embodiment from each other is the focus of explanation.

The above only describes preferred embodiments of the present application and is not intended to limit the protection scope of the present application. Any modification, equivalent replacement, improvement, etc. made within the spirit and the principle of the present application shall be included within the protection scope of the present application.

What is claimed is:

1. A growth method for single crystals of magnesium aluminate spinel by an edge-defined film-fed growth technique, comprising:
   1) loading: putting seed crystals and crystal growth raw materials into a crystal growth furnace;
   2) vacuuming and gas-filling: vacuuming the crystal growth furnace and then filling with inert gas;
   3) heating and melting: raising the temperature of the crystal growth furnace to 2130-2200° C., so that the crystal growth raw materials are melted;
   4) seeding: making the seed crystals contact a top end of a seam of a mold, and then pulling the seed crystals so that the crystal growth raw materials condense and grow on the seed crystals; an upper heat shield and a lower heat shield are arranged above the mold, and a cross section of a slit between the upper heat shield and the lower heat shield is a curved surface;
   5) necking: pulling the seed crystals to shrink the crystals crystallized on the surfaces of the seed crystals;
   6) shouldering: thickening and widening the crystals in an upward pulling process;
   7) equal-width growth: making the crystals grow with the width of the mold in the upward pulling process;
   8) annealing: after the end of crystal growth, starting annealing to cool down.

2. The method according to claim 1, wherein an upper surface of the lower heat shield is a plane, and a lower surface of the upper heat shield is a curved surface; or the upper surface of the lower heat shield is a curved surface, and the lower surface of the upper heat shield is a plane.

3. The method according to claim 2, wherein the upper surface of the lower heat shield is a curved surface, the lower surface of the upper heat shield is a plane, and the upper surface of the lower heat shield satisfies at least one of the following features:
   (1) a chord length D of the upper surface of the lower heat shield is 200 mm-400 mm, and a chord height h is 10 mm-30 mm;
   (2) the chord length D of the upper surface of the lower heat shield is 400 mm-700 mm, and the chord height h is 15 mm-60 mm;
   (3) the chord length D of the upper surface of the lower heat shield is 700 mm-1000 mm, and the chord height h is 30 mm-80 mm;
   (4) the chord length D of the upper surface of the lower heat shield is 1000 mm-1500 mm, and the chord height h is 40 mm-100 mm.

4. The method according to claim 2, wherein the upper surface of the lower heat shield is a plane, the lower surface of the upper heat shield is a curved surface, and the lower surface of the upper heat shield satisfies at least one of the following features:

(1) a chord length D of the lower surface of the upper heat shield is 200 mm-400 mm, and a chord height h is 10 mm-30 mm;

(2) the chord length D of the lower surface of the upper heat shield is 400 mm-700 mm, and the chord height h is 15 mm-60 mm;

(3) the chord length D of the lower surface of the upper heat shield is 700 mm-1000 mm, and the chord height h is 30 mm-80 mm;

(4) the chord length D of the lower surface of the upper heat shield is 1000 mm-1500 mm, and the chord height h is 40 mm-100 mm.

5. The method according to claim 1, wherein the mold has two different temperature gradients in horizontal and vertical directions; the temperature of the mold is gradually reduced from edge to middle on the crystal width, with a temperature gradient of 0.1 to 0.3° C./cm; and the temperature is reduced from bottom to top in the vertical direction above the mold, with a temperature gradient of 1-30° C./cm.

6. The method according to claim 1, wherein the steps of heating and melting comprise: heating the crystal growth furnace to 2130-2200° C., and then holding the temperature for 30-180 min to melt the crystal growth raw materials, so that the crystal growth raw material melt rises to the top end of the seam of the mold.

7. The method according to claim 1, wherein the steps of seeding comprise: lowering the seed crystals to make the seed crystals contact the top end of the seam of the mold, then raising the temperature by 3-10° C. to melt the seed crystals, holding the temperature for 1-30 min, then lowering the temperature by 5-30° C. and pulling the seed crystals at a rate of 1-100 mm/h so that the crystal growth raw materials condense and grow on the seed crystals.

8. The method according to claim 1, wherein the steps of necking comprise: pulling the seed crystals and increasing the temperature by 3-20° C., so that the crystals on the surfaces of the seed crystals shrink to $\frac{1}{4}$-$\frac{3}{4}$ of the area of the seed crystals.

9. The method according to claim 1, wherein the steps of shouldering comprise: reducing the temperature by 5-30° C. and adjusting a pulling speed to 1-100 mm/h so that the crystals become thicker and wider in the upward pulling process until the crystal width reaches the width of the mold.

10. The method according to claim 1, wherein the mold is composed of two metal plates; space between the two metal plates is 0.1-1 mm to form a seam; the top end of the seam of the mold is provided with an opening; and an angle of the opening is 80°-180°.

11. The method according to claim 1, wherein the inert gas is at least one of Ar or $N_2$.

\* \* \* \* \*